(12) United States Patent
Hatada et al.

(10) Patent No.: US 9,257,395 B2
(45) Date of Patent: Feb. 9, 2016

(54) SEMICONDUCTOR DEVICE

(71) Applicant: Sony Corporation, Tokyo (JP)

(72) Inventors: Izuho Hatada, Kanagawa (JP); Hiizu Ootorii, Kanagawa (JP); Shuichi Oka, Kanagawa (JP); Shusaku Yanagawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/306,432

(22) Filed: Jun. 17, 2014

(65) Prior Publication Data

US 2015/0001718 A1    Jan. 1, 2015

(30) Foreign Application Priority Data

Jun. 26, 2013   (JP) ................. 2013-133772

(51) Int. Cl.
*H01L 23/52*    (2006.01)
*H01L 23/48*    (2006.01)
*H01L 23/552*    (2006.01)

(52) U.S. Cl.
CPC ..... *H01L 23/552* (2013.01); *H01L 2224/16225* (2013.01)

(58) Field of Classification Search
CPC ...................................................... H01L 23/552
USPC ................................................. 257/741, 781
See application file for complete search history.

(56) References Cited

U.S. PATENT DOCUMENTS

| | | | |
|---|---|---|---|
| 6,573,537 B1 * | 6/2003 | Steigerwald et al. | 257/103 |
| 7,109,529 B2 * | 9/2006 | Uemura et al. | 257/99 |
| 7,298,030 B2 * | 11/2007 | McWilliams et al. | 257/680 |

FOREIGN PATENT DOCUMENTS

| | | |
|---|---|---|
| JP | 2003-204150 | 7/2003 |
| JP | 2004-273795 | 9/2004 |

\* cited by examiner

*Primary Examiner* — Luan C Thai
(74) *Attorney, Agent, or Firm* — Dentons US LLP

(57) ABSTRACT

A semiconductor device includes a base substrate on which a substrate electrode is arranged, and a semiconductor element which includes a chip electrode electrically connected via solder to the substrate electrode and in which a light absorbing layer is formed on a lower surface side.

11 Claims, 15 Drawing Sheets

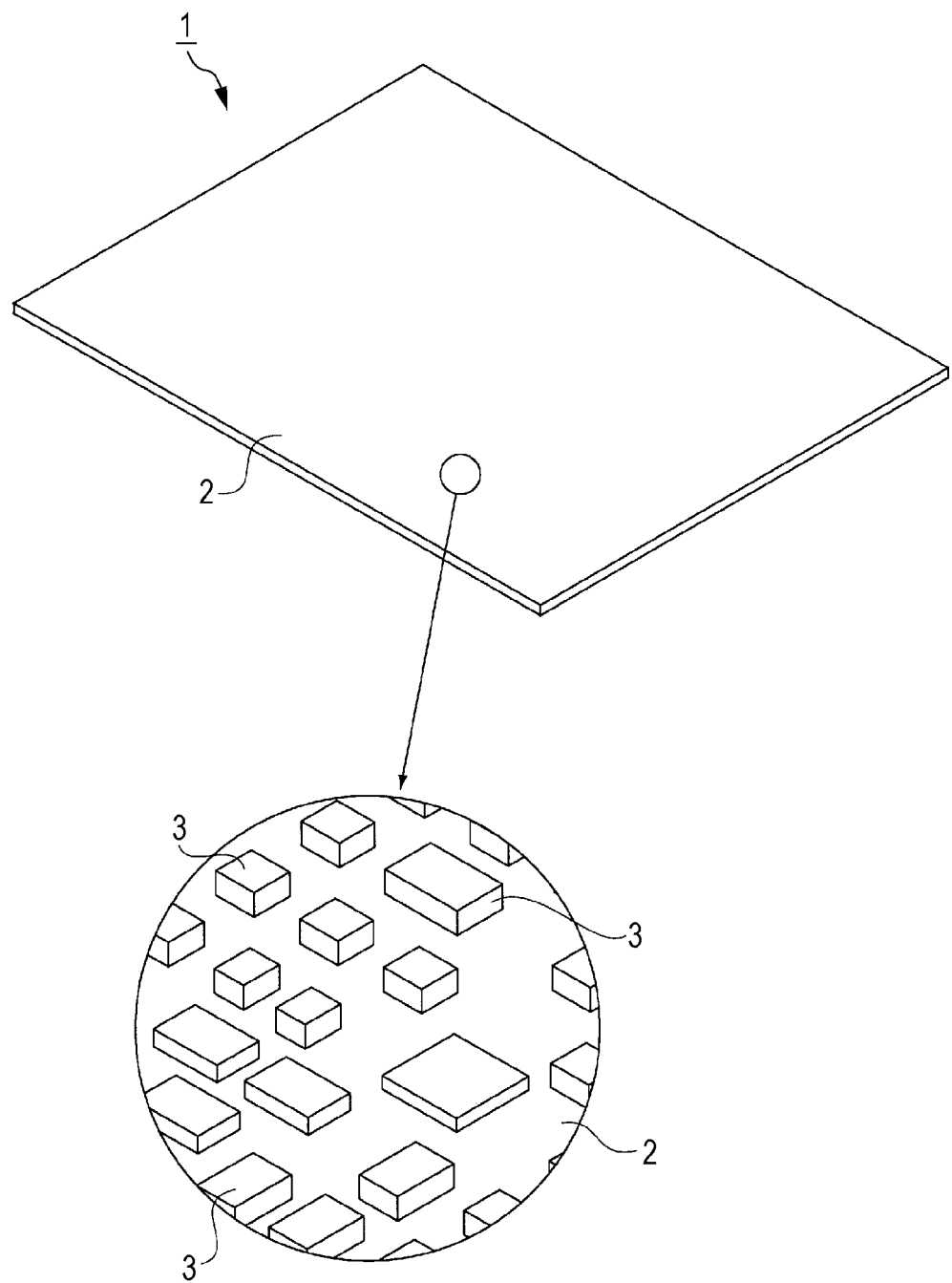

SEMICONDUCTOR DEVICE

CROSS REFERENCE TO RELATED APPLICATIONS

This application claims the benefit of Japanese Priority Patent Application JP 2013-133772 filed Jun. 26, 2013, the entire contents of which are incorporated herein by reference.

BACKGROUND

The present technology relates to a semiconductor device with a semiconductor element mounted on a base substrate.

In a semiconductor device with semiconductor elements integrated in a high density on a base substrate, when a failure of the semiconductor element is found, removal of the semiconductor element from the semiconductor device can be considered.

Several proposals have been made with respect to a method of removing the semiconductor element from the semiconductor device. For example, in Japanese Unexamined Patent Application Publication No. 2003-204150, a method of removing the semiconductor element (electronic component 41 in Japanese Unexamined Patent Application Publication No. 2003-204150) using a method of blowing heated gas onto the semiconductor element has been proposed. In addition, in Japanese Unexamined Patent Application Publication No. 2004-273795, a method of removing the semiconductor element (electronic component 8 in Japanese Unexamined Patent Application Publication No. 2004-273795) by coating light absorbing material on the failed semiconductor element, and by irradiating laser light thereon has been proposed.

SUMMARY

However, in a method described in Japanese Unexamined Patent Application Publication No. 2003-204150, there is a possibility that heated gas will affect a normal semiconductor element mounted around a failed semiconductor element, thereby causing the normal semiconductor element to fail, or the normal semiconductor element to be removed.

In addition, in Japanese Unexamined Patent Application Publication No. 2004-273795, it is necessary to include a process of coating light absorbing material on the failed semiconductor element, thereby increasing a cost.

Here, in the present technology, it is desirable to remove only a failed semiconductor element from a semiconductor device without an increase in manufacturing cost.

A semiconductor device according to an embodiment of the present technology includes a base substrate on which a substrate electrode is arranged, and a semiconductor element which includes a chip electrode electrically connected via solder to the substrate electrode and in which a light absorbing layer is formed on a lower surface side.

Since the light absorbing layer is formed in the semiconductor element, it is possible to remove the semiconductor element using the laser beam, and it is unnecessary to coat the light absorbing material.

In the semiconductor device according to an embodiment of the above-described present technology, a heat diffusing layer which is in contact with the light absorbing layer may be formed on a lower surface side of the semiconductor element.

Since the heat diffusing layer which is in contact with the light absorbing layer is formed, it is possible to transfer the heat received at the light absorbing layer to the solder more than usual.

In the semiconductor device according to an embodiment of the above-described present technology, a light reflecting layer may be formed on an upper surface side of the base substrate.

For this reason, the solder is heated by the reflection light from the light reflecting layer.

In the semiconductor device according to an embodiment of the above-described present technology, the light reflecting layer may be electrically connected to the substrate electrode.

For this reason, the heat generated at the light reflecting layer according to the irradiation of the laser beam is easily transferred to the solder.

In the semiconductor device according to an embodiment of the above-described present technology, a protection layer which is in contact with the light reflecting layer may be formed on a lower surface side of the light reflecting layer.

For this reason, it is difficult for the heat generated at the light reflecting layer according to the irradiation of the laser beam to be transferred to a layer lower than the protection layer.

In the semiconductor device according to an embodiment of the above-described present technology, the semiconductor element may have a void portion in which the light absorbing layer is not formed on the lower surface side, and the light reflecting layer may be formed on a portion which is opposed to the void portion in the upper surface side of the base substrate.

For this reason, the laser beam which passes through the semiconductor element is reflected by the light reflecting layer of the base substrate, and the laser beam is not directly irradiated in a layer lower than the light reflecting layer.

In the semiconductor device according to an embodiment of the above-described present technology, the light absorbing layer may be formed by including any one of Ti, Ni, Pt, Sn and W.

For this reason, the light absorbing layer easily absorbs the laser beam.

In the semiconductor device according to an embodiment of the above-described present technology, the heat diffusing layer may be formed by including any one of Al, Cu, Au and Ag.

For this reason, the heat received at the light absorbing layer is easily diffused by the heat diffusing layer.

In the semiconductor device according to an embodiment of the above-described present technology, the light reflecting layer may be formed by including any one of Al, Cu, Au and Ag.

For this reason, the laser beam is easily reflected by the light reflecting layer.

In the semiconductor device according to an embodiment of the above-described present technology, the protection layer may be formed by including any one of Ti, Ni, Pt, Sn and W.

For this reason, it is difficult for the heat generated at the light reflecting layer by the irradiation of the laser beam to be transferred to lower parts of the protection layer.

According to the present technology, it is possible to remove the semiconductor element using the laser beam, and it is unnecessary to coat the light absorbing material. Thus, it is possible to remove only the failed semiconductor element from the semiconductor device without an increase in manufacturing cost.

BRIEF DESCRIPTION OF THE DRAWINGS

FIG. 1 illustrates the present embodiments together with FIGS. 2A to 15, and is a perspective view illustrating the whole of a semiconductor device;

DETAILED DESCRIPTION OF EMBODIMENTS

Figure 2A:
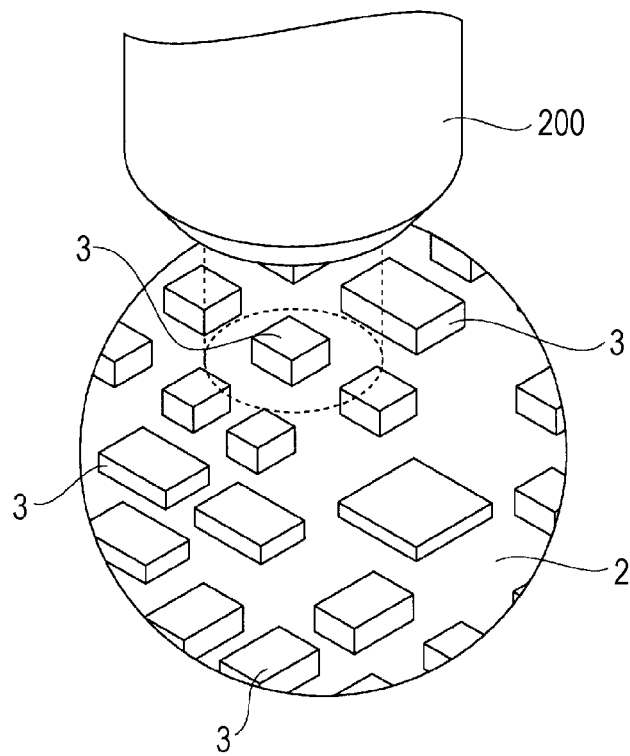
FIGS. 2A and 2B are enlarged perspective views illustrating a state where a failed semiconductor element is removed from the semiconductor device.

Hereinafter, embodiments for realizing a semiconductor device according to the present technology will be described with reference to the accompanying drawings.

Hereinafter, examples in which the present technology is applied to a semiconductor device with semiconductor elements integrated in a high density, will be described. Meanwhile, the present technology can be widely applied to a semiconductor device with semiconductor elements mounted on a base substrate.

Description of the embodiments will be made in the following sequence.
1. Whole Configuration of Semiconductor Device
2. Method of Removing Semiconductor Element
3. Structure of Semiconductor Device According to First Embodiment
4. Operation and Effects when Removing Semiconductor Element
5. Second Embodiment
6. Third Embodiment
7. Arrangement Patterns of Chip UBM Layer and Substrate UBM Layer
7-1. First Arrangement Pattern
7-2. Second Arrangement Pattern
7-3. Third Arrangement Pattern
7-4. Fourth Arrangement Pattern
7-5. Other Arrangement Pattern
8. Modification Example Regarding Shape of Semiconductor Element
9. Example without Void Portion
10. Summary 1. Whole Configuration of Semiconductor Device As illustrated in FIG. 1, a semiconductor device 1 includes a base substrate 2 and a plurality of semiconductor elements 3, 3, . . . which are mounted on the base substrate 2 using solder or the like.

The semiconductor elements 3, 3, . . . are mounted on the base substrate 2 by a pitch of several 10 μm to several 100 μm, and mounted in a relatively high density.

2. Method of Removing Semiconductor Element

Here, in a case where the semiconductor device 1 such as that described above is manufactured, in an inspection process after the semiconductor elements 3, 3, . . . are mounted on the base substrate 2, a failed semiconductor element 3 can be found. At this time, since the semiconductor elements 3, 3, . . . are mounted in a relatively high density in the same way as described above, there is a case where it is difficult to remove only the failed semiconductor element 3.

Figure 2B:
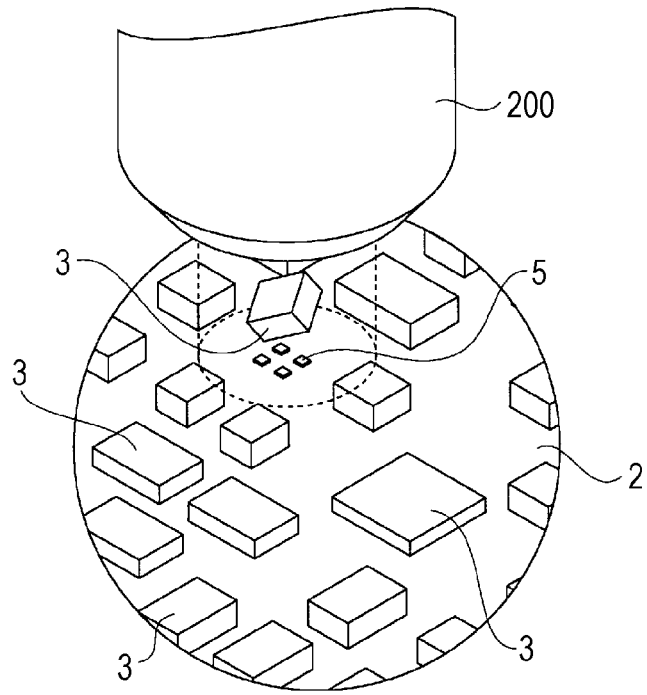

Thus, in the embodiments described hereinafter, as a method of removing the failed semiconductor element 3 from the base substrate 2, a method of using a removal apparatus 200 such as that illustrated in FIGS. 2A and 2B is employed. The removal apparatus 200 is configured in such a way that irradiation of a laser beam and absorption of a component are possible.

As illustrated in FIG. 2A, the laser beam is irradiated from an upper part by the removal apparatus 200 in the semiconductor element 3 set as a removal target, and thereby solder which bonds the semiconductor element 3 to the base substrate 2 is dissolved. At this time, a wavelength, which passes through a substrate portion 6 of the semiconductor element 3, of the laser beam which is emitted from the removal apparatus 200, is selected. For example, in a case where the substrate portion 6 is formed from Si, the laser beam with a longer wavelength than 1 nm is selected, and in a case where the substrate portion 6 is formed from GaAs, the laser beam with a longer wavelength than 900 nm is selected.

Next, as illustrated in FIG. 2B, the semiconductor element 3 is separated from the base substrate 2 together with the dissolved solder by being absorbed by the removal apparatus 200.

As a result, although the semiconductor elements 3, 3, . . . are mounted in a relatively high density, the failed semiconductor element 3 can be removed from the base substrate 2.

3. Structure of Semiconductor Device According to First Embodiment

Figure 3:
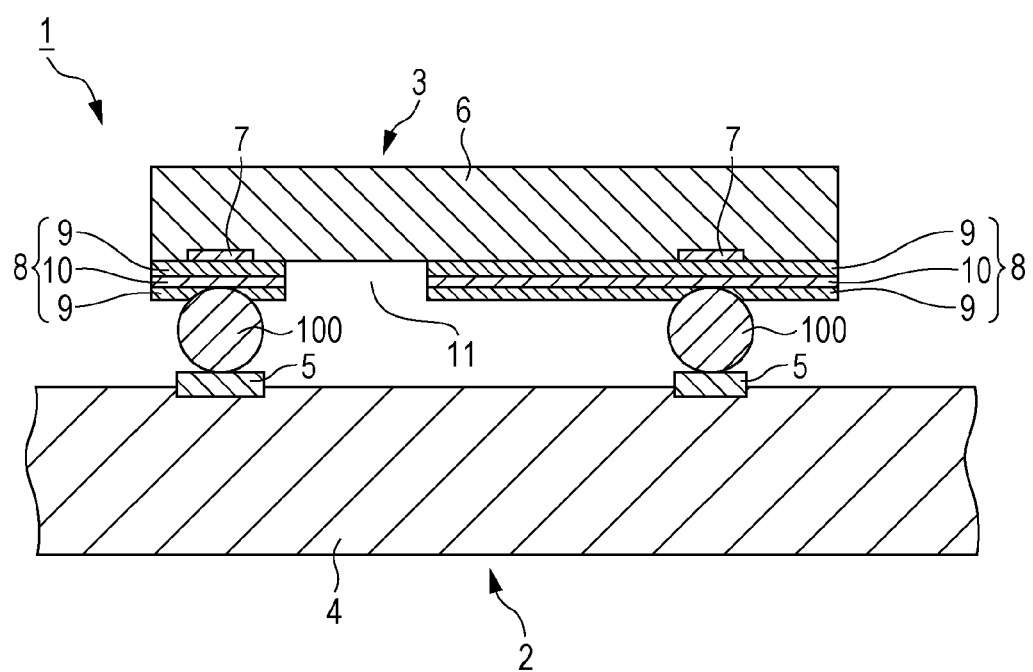
FIG. 3 is an enlarged schematic cross-sectional view illustrating a portion of a semiconductor device according to a first embodiment.

On the assumption of the above-described removing method, a specific structure of the semiconductor device 1 according to a first embodiment will be described with reference to FIG. 3.

The base substrate 2 includes a substrate portion 4 and a plurality of substrate electrodes 5, 5, . . . , which are formed on upper surface sides of the substrate portion 4, for electrical connection with solder 100. The substrate electrode 5 is formed from a metal whose main component is a conductor such as Cu.

The semiconductor element 3 includes the substrate portion 6, a plurality of chip electrodes 7, 7, . . . formed on a lower surface side of the substrate portion 6, and chip under bump metal (UBM) layers 8, 8, . . . .

The chip electrodes 7, 7, . . . are electrically connected via the chip UBM layers 8, 8, . . . to the solder 100, respectively. In addition, the chip electrode 7 is formed from a metal whose main component is the conductor such as Cu.

The chip UBM layer 8 is a multilayer structure formed by three layers, and has light absorbing layer 9, a heat diffusing layer 10, and a light absorbing layer 9 which are arranged in sequence from top to bottom.

In addition, the chip UBM layers 8, 8, . . . are bonded to the chip electrodes 7, 7, . . . , respectively, but in order to avoid all the chip electrodes 7, 7, . . . being directly conducted to each other, a void portion 11 (unformed portion) is positioned between at least one set of chip UBM layers 8 and 8, and the chip UBM layers 8 and 8 are formed separately.

4. Operation and Effects when Removing Semiconductor Element

Figure 4:
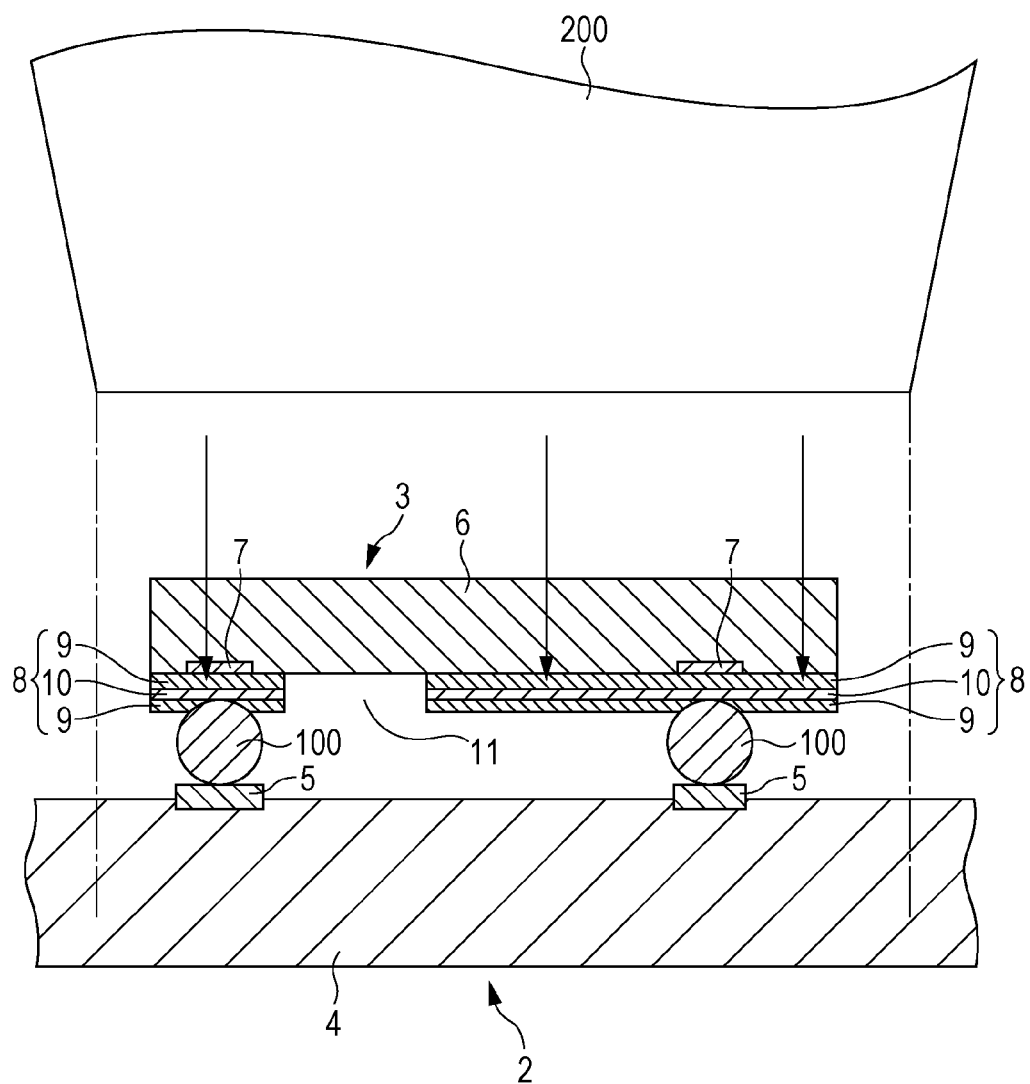
FIG. 4 is an enlarged schematic cross-sectional view illustrating a state where a laser beam is irradiated from a removal apparatus in the first embodiment.

By the above-described method, when the failed semiconductor element 3 is removed from the semiconductor device 1, the laser beam is irradiated in the semiconductor element 3 from the removal apparatus 200 as illustrated by arrows in FIG. 4.

At this time, since the irradiated laser beam is efficiently absorbed into the light absorbing layer 9 of the semiconductor element 3, the solder 100 can be efficiently heated via the chip UBM layer 8.

In addition, the heat diffusing layer 10 which is in contact with the light absorbing layer 9 is formed in the semiconductor element 3, and thereby it is possible to transfer the heat received at the light absorbing layer 9 to the solder 100 more than usual. Thus, it is possible to more efficiently dissolve the solder 100.

Here, it is preferable that the light absorbing layer 9 be formed by including any one of Ti, Ni, Pt, Sn, and W which easily absorb the laser beam. As a result, the light absorbing layer 9 easily absorbs the laser beam, and thereby it is possible to efficiently heat the solder 100 bonded to the lower portion via the chip UBM layer 8.

In addition, it is preferable that the heat diffusing layer 10 be formed by including any one of Al, Cu, AU, and Ag which have a high thermal conductivity. As a result, the heat received at the light absorbing layer 9 is easily diffused by the heat diffusing layer 10, and thereby the heat is transferred to the solder 100 via the chip UBM layer 8 more than usual, and it is possible to more efficiently dissolve the solder 100.

Figure 5:
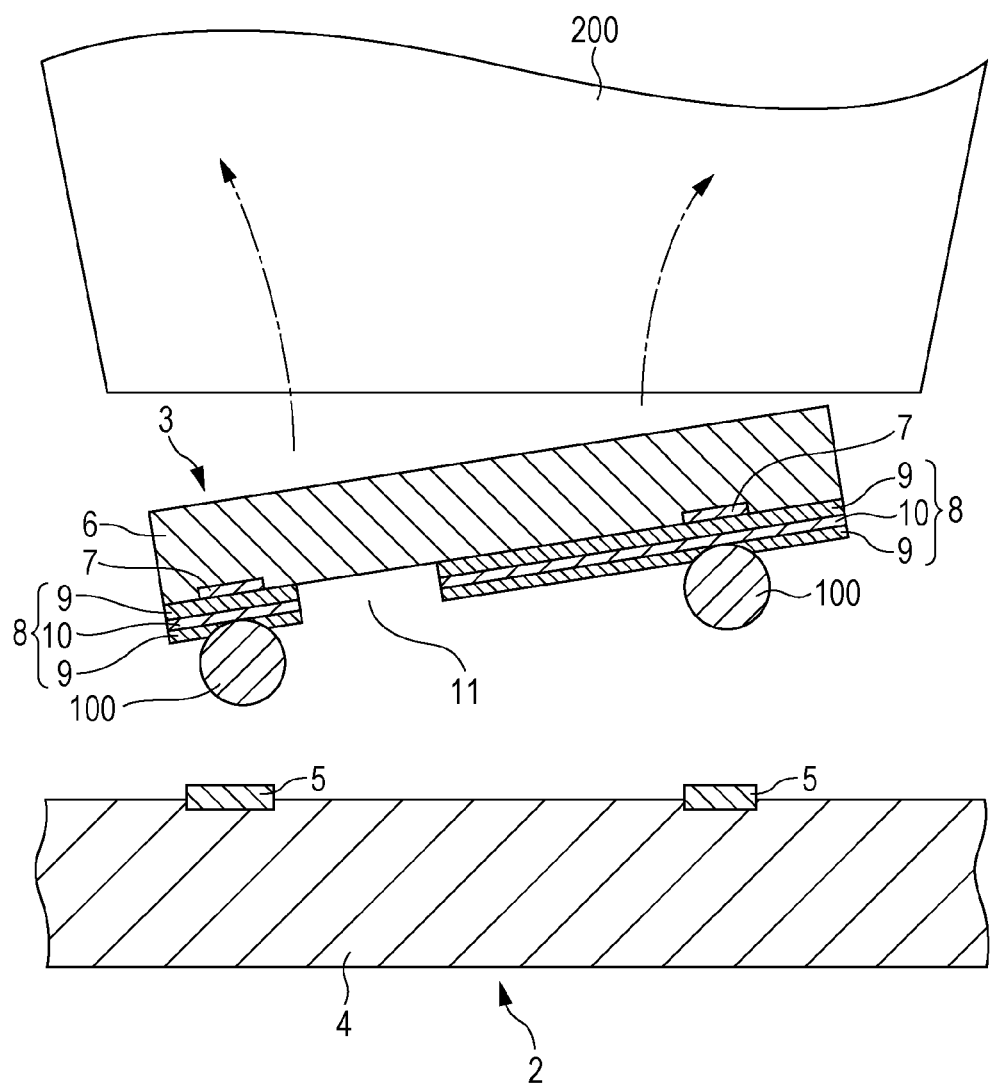
FIG. 5 is an enlarged schematic cross-sectional view illustrating a state where a removal apparatus absorbs a semiconductor element in the first embodiment.

In this way, according to the semiconductor device 1 regarding the first embodiment, it is possible to efficiently dissolve the solder 100. For this reason, when the absorption is performed by the removal apparatus 200, as illustrated in FIG. 5, an amount of solder 100 remaining in the substrate electrode 5 arranged on the upper surface side of the base substrate 2 is reduced. Thus, it is possible to easily perform remounting of the semiconductor element 3 on the position where the semiconductor element 3 is removed.

5. Second Embodiment

A semiconductor device 1A according to a second embodiment will be described with reference to FIGS. 6 and 7.

Meanwhile, in the second embodiment, the parts with the same configuration as in the first embodiment will be denoted with the same symbols and reference numerals as in the first embodiment and description thereof is omitted. Thus, hereinafter, the parts configured differently from those in the first embodiment will be described.

Figure 6:
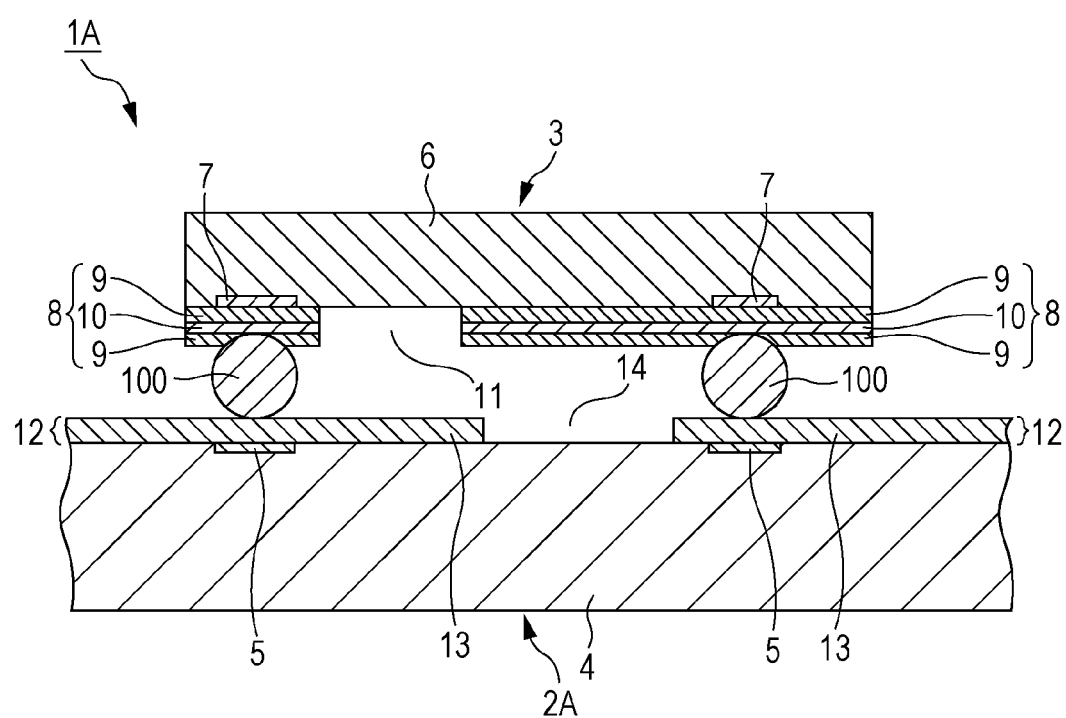
FIG. 6 is an enlarged schematic cross-sectional view illustrating a portion of a semiconductor device according to a second embodiment.

As illustrated in FIG. 6, in the semiconductor device 1A according to the second embodiment, substrate UBM layers 12, 12, . . . used as under bump metal layers are formed on an upper surface side of the base substrate 2A. In the present embodiment, the substrate UBM layers 12, 12, . . . are respectively formed by one layer structure, and are formed by light reflecting layers 13, 13, . . . . The light reflecting layers 13, 13, . . . is formed in such a way that a portion thereof is opposed to a void portion 11 which is positioned on an upper part of the base substrate 2A. Specifically, the light reflecting layers 13, 13, . . . are arranged on the upper surface side of the base substrate 2A so as to cover the whole of portions which is opposed to the void portion 11 in the upper surface side of the substrate portion 4.

The light reflecting layer 13 is bonded to the substrate electrode 5, and the light reflecting layer 13 and the substrate electrode 5 are electrically connected.

Meanwhile, a void portion 14 is formed between at least one set of light reflecting layers 13 and 13, in such a way that the whole of the substrate electrodes 5, 5, . . . is not directly conducted, and the light reflecting layers 13 and 13 are separately formed.

According to the semiconductor device 1A regarding the second embodiment, the laser beam from the removal apparatus 200 is reflected by the light reflecting layers 13, 13, . . . formed on the upper surface side of the base substrate 2A.

Figure 7:
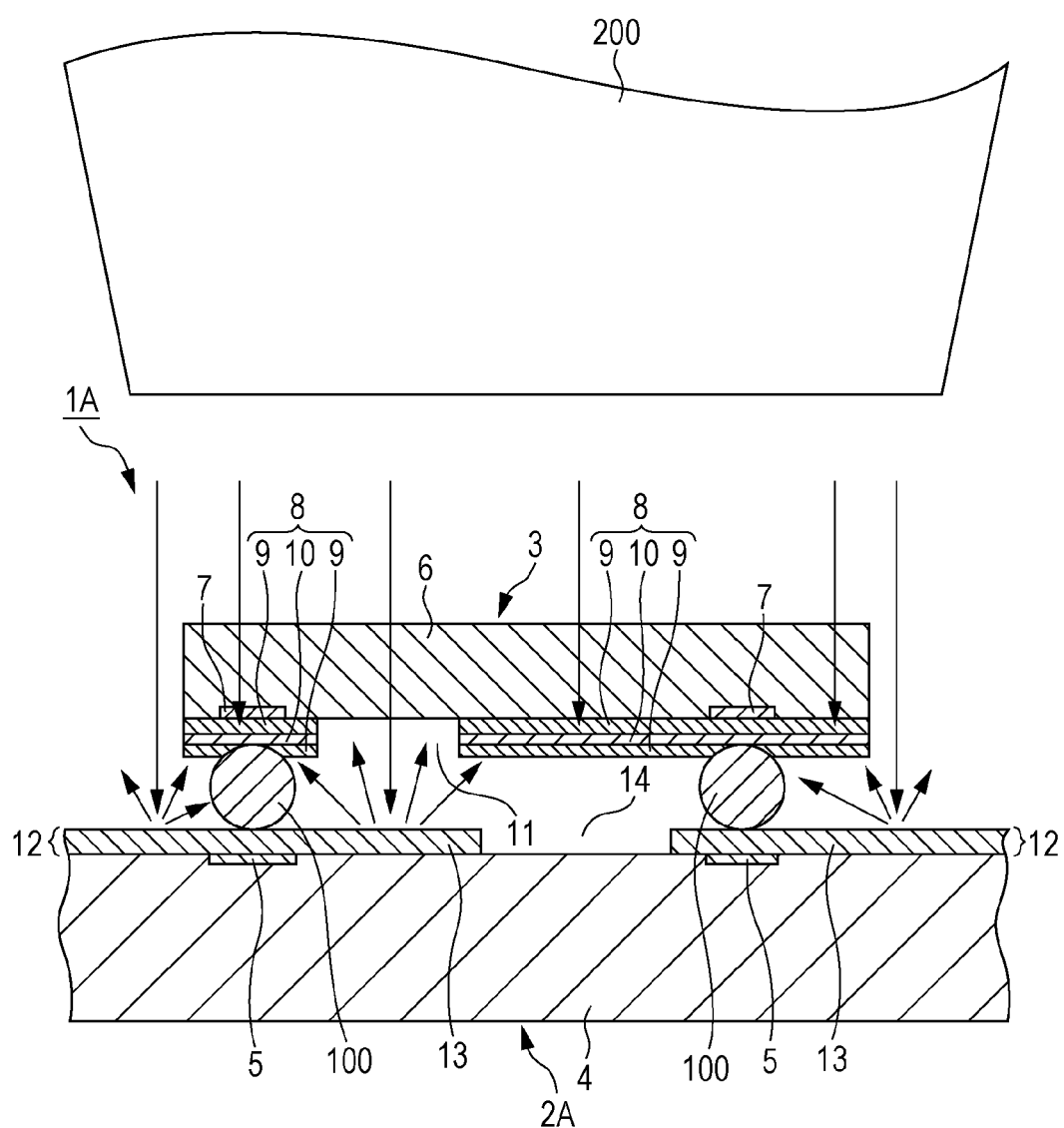
FIG. 7 is an enlarged schematic cross-sectional view illustrating a state where a laser beam is irradiated from a removal apparatus in the second embodiment.

As illustrated in FIG. 7, a portion of the laser beam from the removal apparatus 200 passes through the semiconductor element 3, is emitted from the void portion 11, and is reflected by the light reflecting layer 13. In addition, the other portion of the laser beam passes through between the semiconductor elements 3 and 3 and is reflected by the light reflecting layer 13.

Such a reflected beam is incident and absorbed in a light absorbing layer 9, and is directly irradiated in the solder 100.

The reflected light is absorbed into the light absorbing layer 9, and thereby the solder 100 is heated via the heat diffusing layer 10. In addition, the solder 100 is directly heated by the reflected light which is irradiated in the solder 100.

In this way, the semiconductor device 1A includes the light reflecting layers 13, 13, . . . on the upper surface side of the base substrate 2A, and thereby the solder 100 can also be heated by the reflected light from the light reflecting layers 13, 13, . . . . Thus, it is possible to efficiently heat the solder 100.

In addition, since the light reflecting layer 13 is electrically connected to the substrate electrode 5 and thereby the heat generated at the light reflecting layer 13 is transferred to the solder 100, it is possible to efficiently heat the solder 100.

Furthermore, since the light reflecting layer 13 is formed on the portion which is opposed to the void portion 11 of the semiconductor element 3 in the upper surface side of the base substrate 2A and thereby the laser beam which passes through the semiconductor element 3 is not directly irradiated in the substrate portion 4 which is positioned in the lower side of the light reflecting layer 13, it is possible to suppress damage of the substrate portion 4.

At this time, it is preferable that the light reflecting layer 13 of the base substrate 2A be formed by including any one of Al, Cu, Au, and Ag which easily reflect the laser beam. As a result, since the light reflecting layer 13 easily reflects the laser beam, it is possible to more efficiently heat the solder 100 by using the laser beam which passes through the semiconductor element 3.

6. Third Embodiment

A semiconductor device 1B according to a third embodiment will be described with reference to FIG. 8.

Meanwhile, in the third embodiment, the parts with the same configuration as in the first embodiment and the second embodiment will be denoted with the same symbols and reference numerals as in the first and second embodiments and description thereof is omitted. Thus, hereinafter, the parts configured differently from those in the first embodiment and the second embodiment will be described.

Figure 8:
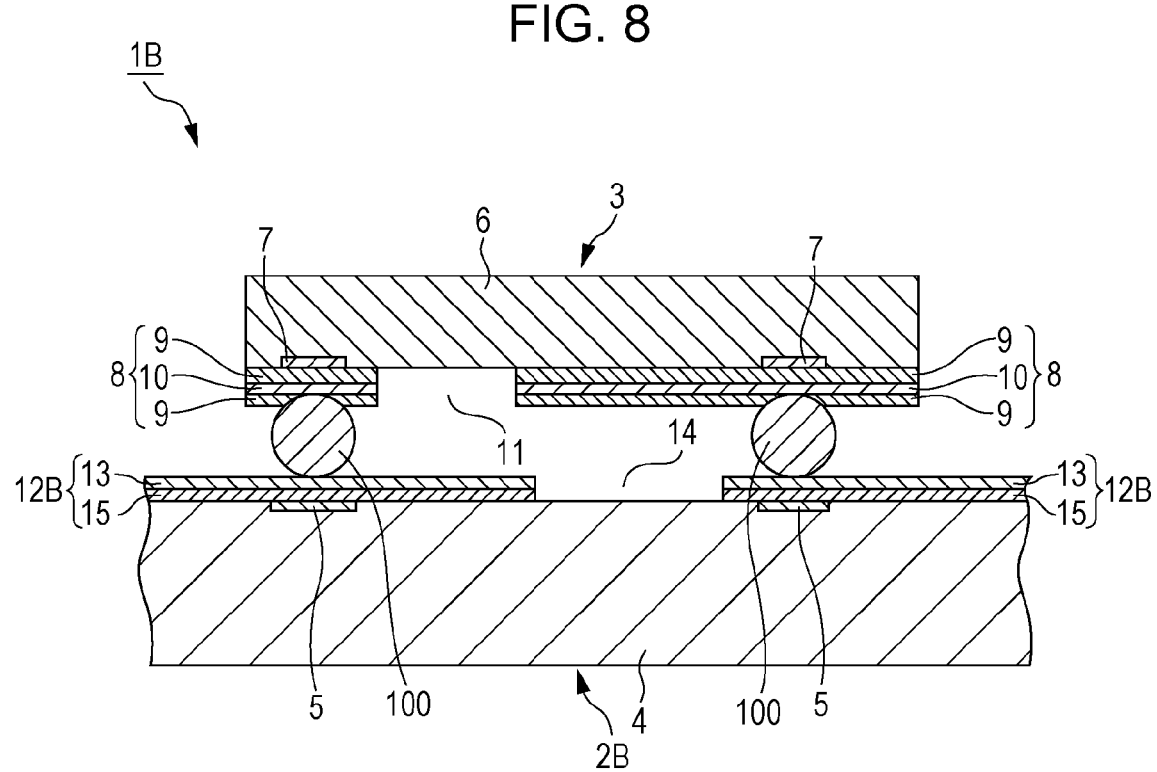
FIG. 8 is an enlarged schematic cross-sectional view illustrating a portion of a semiconductor device according to a third embodiment.

As illustrated in FIG. 8, in the semiconductor device 1B regarding the third embodiment, substrate UBM layers 12B, 12B, . . . which are bonded to an upper surface side of the base substrate 2B are respectively formed by two layer structure. The light reflecting layer 13 and a protection layer 15 are arranged in sequence from top to bottom on each substrate UBM layer 12B.

Since the protection layer 15 is formed between the substrate portion 4 of the base substrate 2B and the light reflecting layer 13 and thereby the heat generated at the light reflecting layer 13 according to the laser beam irradiation is not directly transferred to the substrate portion 4, it is possible to suppress the damage of the substrate portion 4 from occurring.

At this time, it is preferable that the protection layer 15 of the base substrate 2B be formed by including any one of Ti, Ni, Pt, Sn, and W which easily absorb heat. As a result, since it is difficult for the heat generated at the light reflecting layer 13 by irradiating the laser beam to be transferred to the substrate portion 4, it is possible to further suppress the damage of the substrate portion 4 of the base substrate 2B from occurring.

7. Arrangement Patterns of Chip UBM Layer and Substrate UBM Layer

Here, an example of the arrangement patterns of the chip UBM layer 8 and the substrate UBM layer 12 (12B) in the semiconductor device 1A (1B) according to the second embodiment and the third embodiment which are described above, will be described.

7-1. First Arrangement Pattern

Figure 9A:
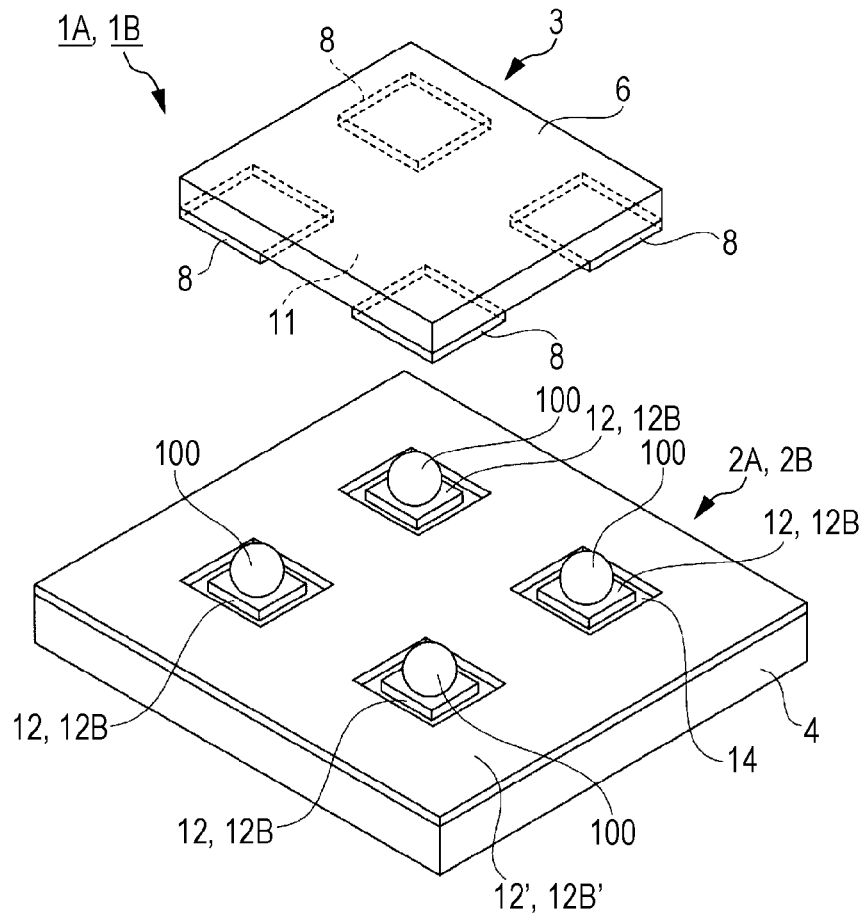
FIGS. 9A and 9B are views illustrating examples of an arrangement pattern of a chip UBM layer and an arrangement pattern of a substrate UBM layer, together with FIGS. 10 to 12, and are enlarged perspective views illustrating a first arrangement pattern.
Figure 9B:
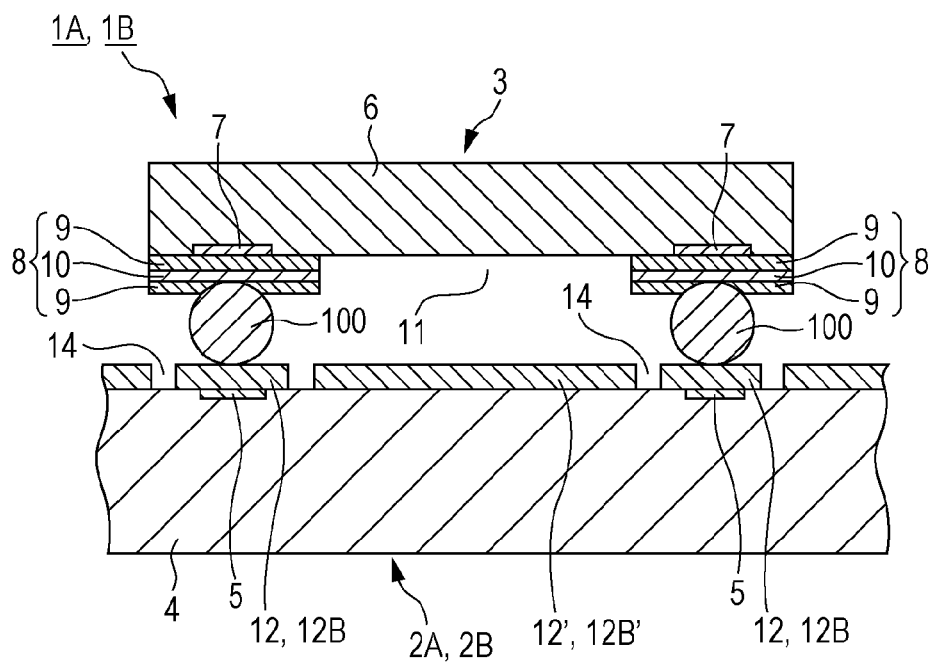

First arrangement patterns illustrated in FIGS. 9A and 9B are arrangement patterns in which it is assumed that a case where the chip electrodes 7, 7, . . . and substrate electrodes 5, 5, . . . are respectively formed as independent terminals which transfer different signals. In the examples of these figures, four chip electrodes 7, 7, 7 and 7 are formed on a lower surface side of the semiconductor element 3. The chip UBM layers 8, 8, 8 and 8 which are bonded to the chip electrodes 7, 7, 7 and 7 are arranged so as to be separated, respectively, in such a way that such chip electrodes 7, 7, 7 and 7 are not directly connected to each other. The chip UBM layers 8, 8, 8 and 8 are formed in an approximately square shape, and in this case the void portion 11 is formed in approximately a cross shape on the lower surface side of the semiconductor element 3.

On the upper surface side of the base substrate 2A (2B), the substrate UBM layers 12, 12, 12 and 12 (12B, 12B, 12B and 12B) which are bonded to the substrate electrodes 5, 5, 5 and 5, and a metal layer 12' (12B) are formed. The metal layer 12' is a metal layer which is configured by the light reflecting layer 13 similar to the substrate UBM layer 12, and a metal layer 12B' is a metal layer on which the light reflecting layer 13 similar to the substrate UBM layer 12B, and the protection layer 15 are arranged from top to bottom.

The void portions 14, 14, 14 and 14 are formed between the metal layer 12' (12B') and the substrate UBM layers 12, 12, 12 and 12 (12B, 12B, 12B and 12B), and thereby the substrate electrodes 5, 5, 5 and 5 are not directly conducted to each other.

The metal layer 12' (12B') is formed so as to cover the whole of a portion which is opposed to the void portion 11 formed on the lower surface side of the semiconductor element 3. Thus, the light reflecting layer is formed so as to cover the whole of a portion which is opposed to the void portion 11 on the upper surface side of the base substrate 2A (2B). For this reason, the substrate portion 4 is not directly irradiated by the laser beam which passes through the void portion 11.

In addition, in the first arrangement pattern, the chip UBM layers 8, 8, 8 and 8 are formed so as to cover the void portions 14, 14, 14 and 14 on the base substrate 2A (2B) side (refer to FIG. 9B). For this reason, the laser beam which passes through the void portion 11 on the semiconductor element 3 side is prevented from being irradiated into the void portions 14, 14, 14 and 14 on the base substrate 2A (2B) side, and it is possible to suppress the damage of the substrate portion 4.

7-2. Second Arrangement Pattern

Figure 10:
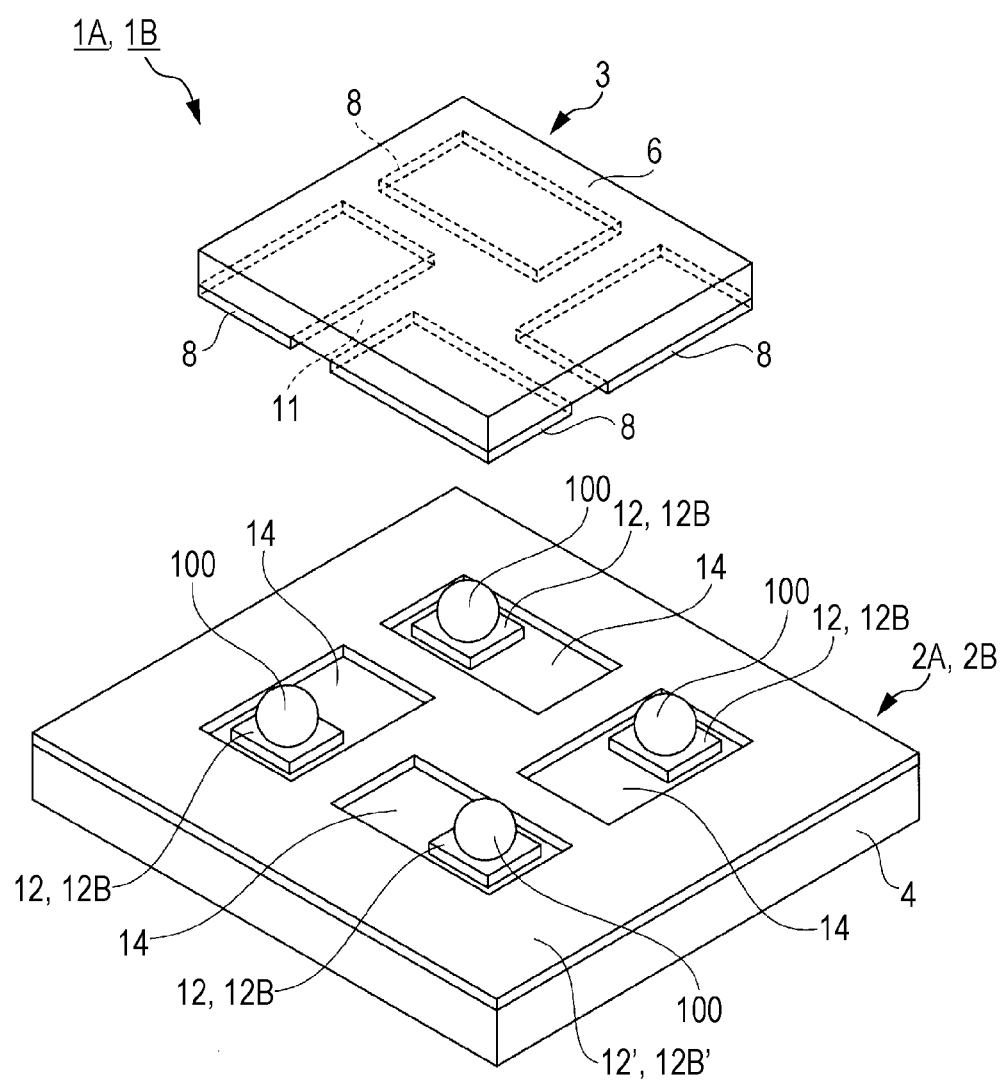
FIG. 10 is an enlarged perspective view illustrating a second arrangement pattern.

A second arrangement pattern illustrated in FIG. 10 has a shape, which is different from the shape of the first arrangement pattern, of each chip UBM layer 8 and each void portion 14. Specifically, in the second arrangement pattern, the chip UBM layers 8, 8, 8 and 8 have rectangular shapes. For this reason, the void portions 14, 14, 14 and 14 in the base substrate 2A (2B) have outer edge shapes of the same rectangular shape as each other.

7-3. Third Arrangement Pattern

Figure 11:
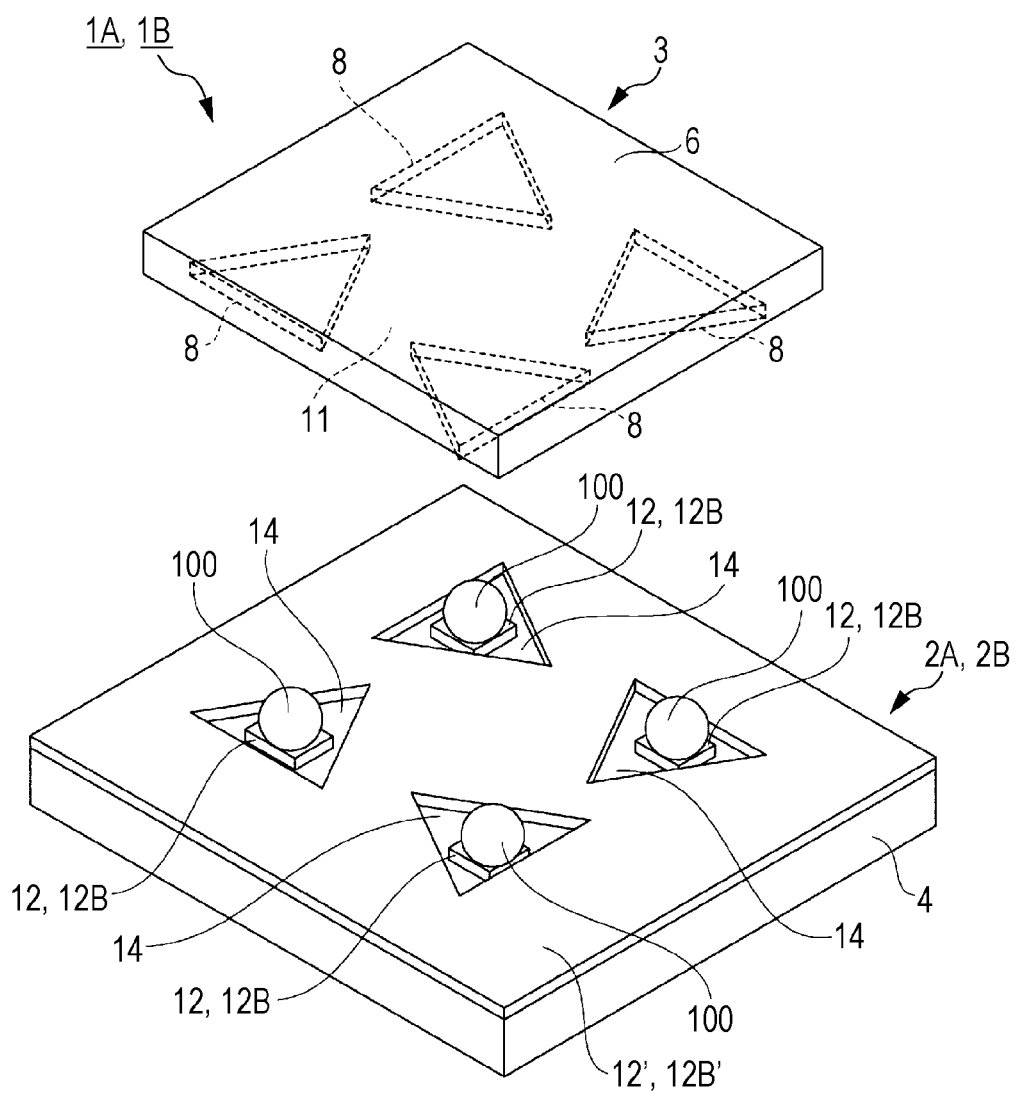
FIG. 11 is an enlarged perspective view illustrating a third arrangement pattern.

In a third arrangement pattern illustrated in FIG. 11, each chip UBM layer 8 of the semiconductor element 3 has a triangular shape. For this reason, each void portion 14 in the base substrate 2A (2B) also has an outer edge shape of a triangular shape.

7-4. Fourth Arrangement Pattern

A fourth arrangement pattern is an example in which terminals with the same potential as each other in the chip electrodes 7, 7, . . . of the semiconductor element 3 and in the substrate electrodes 5, 5, . . . of the base substrate 2A (2B) are formed.

Figure 12:
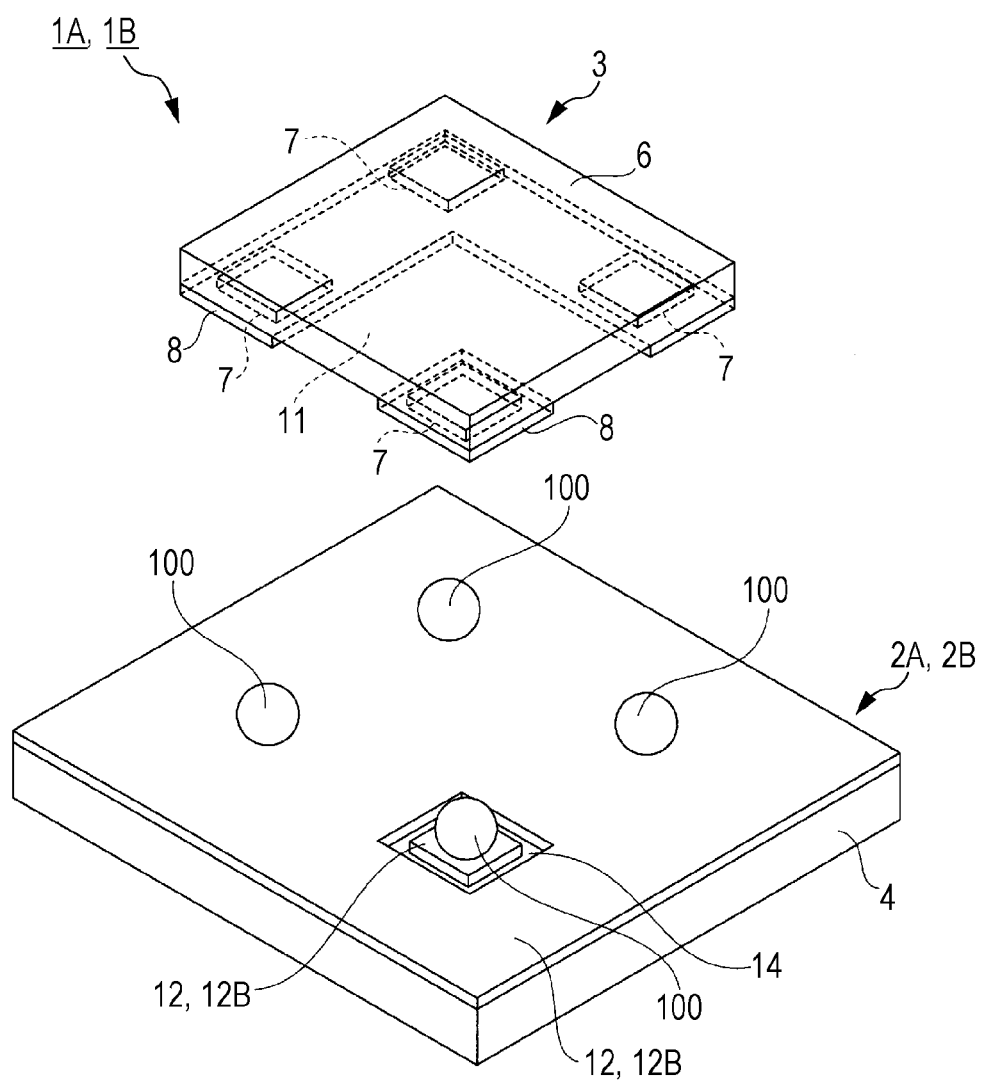
FIG. 12 is an enlarged perspective view illustrating a fourth arrangement pattern.

In the example illustrated in FIG. 12, the three chip electrodes 7, 7 and 7 among the four chip electrodes 7, 7, 7 and 7 in the semiconductor element 3 are formed by the terminals which have the same potential as each other and are electrically connected via the common chip UBM layer 8 to each other. The remaining one chip electrode 7 is a terminal different from the three terminals with the same potential as each other, the chip UBM layer 8 arranged in a lower part of the related chip electrode 7 is formed so as to be separated from the common chip UBM layer 8 via the void portion 11, and thereby the terminals without the same potential as each other are not directly conducted to each other.

In the upper surface side of the base substrate 2A (2B), the common substrate UBM layer 12 (12B) bonded to the three substrate electrodes 5, 5 and 5 which are the terminals with the same potential as each other, and the substrate UBM layer 12 (12B) bonded to the substrate electrode 5 which is the terminal different from the terminals with the same potential as each other, are formed. The void portion 14 is formed between such two substrate UBM layers 12 (12B), and the terminals without the same potential as each other are not directly conducted to each other.

The common substrate UBM layer 12 (12B) is formed on the upper surface side of the base substrate 2A so as to cover the whole of the portion which is opposed to the void portion 11 in the upper surface side of the substrate portion 4. For this reason, the substrate portion 4 is not directly irradiated by the laser beam which passes through the void portion 11.

In addition, in the semiconductor element 3 side, the ship UBM layer 8 which is formed so as to be separated from the common chip UBM layer 8 is formed so as to cover the void portion 14 on the base substrate 2A (2B). For this reason, the laser beam which passes the void portion 11 can be prevented from being irradiated into the void portion 14.

7-5. Other Arrangement Pattern

The arrangement patterns of the chip UBM layer 8 and the substrate UBM layer 12 (12B) are not limited to those illustrated in the first to fourth arrangement patterns described above, and the light reflecting layer 13 may be formed in such a way that the laser beam which passes through the void portion 11 formed between the chip UBM layers 8, 8, . . . is reflected by the light reflecting layer 13 of the base substrate 2A (2B).

8. Modification Example Regarding Shape of Semiconductor Element

In a case where the semiconductor elements 3 are lined up on the base substrate 2 (2A, 2B) without a gap, when the laser beam is irradiated in the semiconductor element 3 which is a removal target, it is considered that a portion of the laser beam is irradiated in the adjacent semiconductor element 3. At this time, there is a case where the adjacent normal semiconductor element 3 is damaged.

It is necessary to study the shape of the semiconductor element 3 and the arrangement of the solders 100, 100, . . . which are bonded to the lower portion of the semiconductor element 3.

Figure 13:
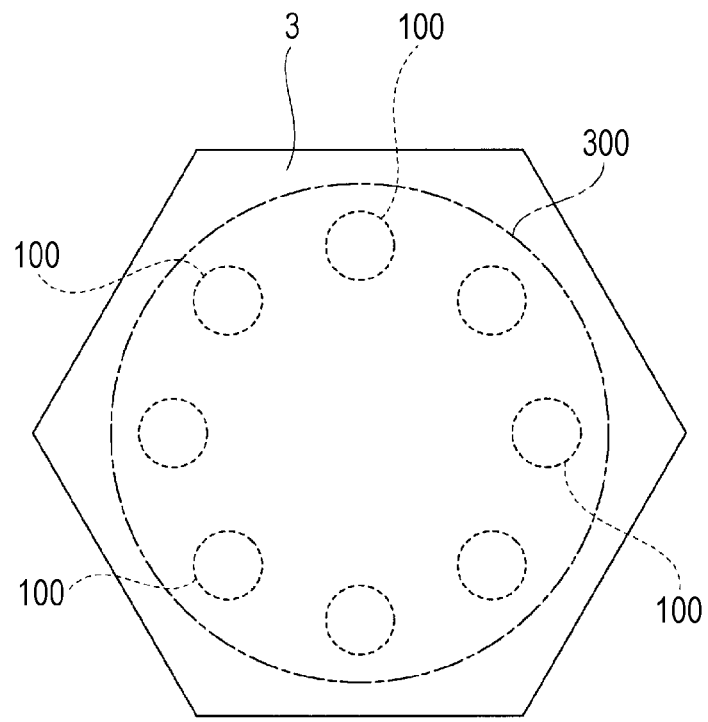
FIG. 13 is an enlarged schematic plan view illustrating a modification example according to a shape of a semiconductor element.

In the example illustrated in FIG. 13, the semiconductor element 3 is formed in a hexagonal shape, and the solders 100, 100, . . . are arranged so as to be positioned at an equal distance from a center point of the hexagonal shape of the semiconductor element 3.

Since an irradiation spot 300 of the laser beam is approximately a circular shape, the laser beam can be irradiated in all the solders 100, 100, . . . and the irradiation range can be fit inside a peripheral edge of the semiconductor element 3, by adjusting a diameter of the irradiation spot 300.

As a result, it is possible to remove the semiconductor element 3 which is the removal target, without damaging the semiconductor element 3 adjacent to the semiconductor element 3 which is the removal target.

Meanwhile, the semiconductor element 3 may be configured by a combination of the triangular shapes, a plurality of shapes, or the like, instead of the above-described hexagonal shape.

9. Example without Void Portion

In the examples described up to now, the chip UBM layer 8, 8, . . . and the substrate UBM layer 12, 12, . . . (12B, 12B, . . . ) are separately formed, and thus the void portion 11 of the semiconductor element 3 and the void portion 14 of the base substrate 2 (2A, 2B) are formed. However, it is possible to be configured in such a way that either the void portion 11 or the void portion 14 is not formed. Here, the void portion 11 indicates a portion where the substrate portion 6 on the lower surface side of the semiconductor element 3 is exposed on the lower parts, and the void portion 14 indicates a portion where the substrate portion 4 on the upper surface side of the base substrate 2 (2A, 2B) is exposed on the upper parts.

Figure 14:
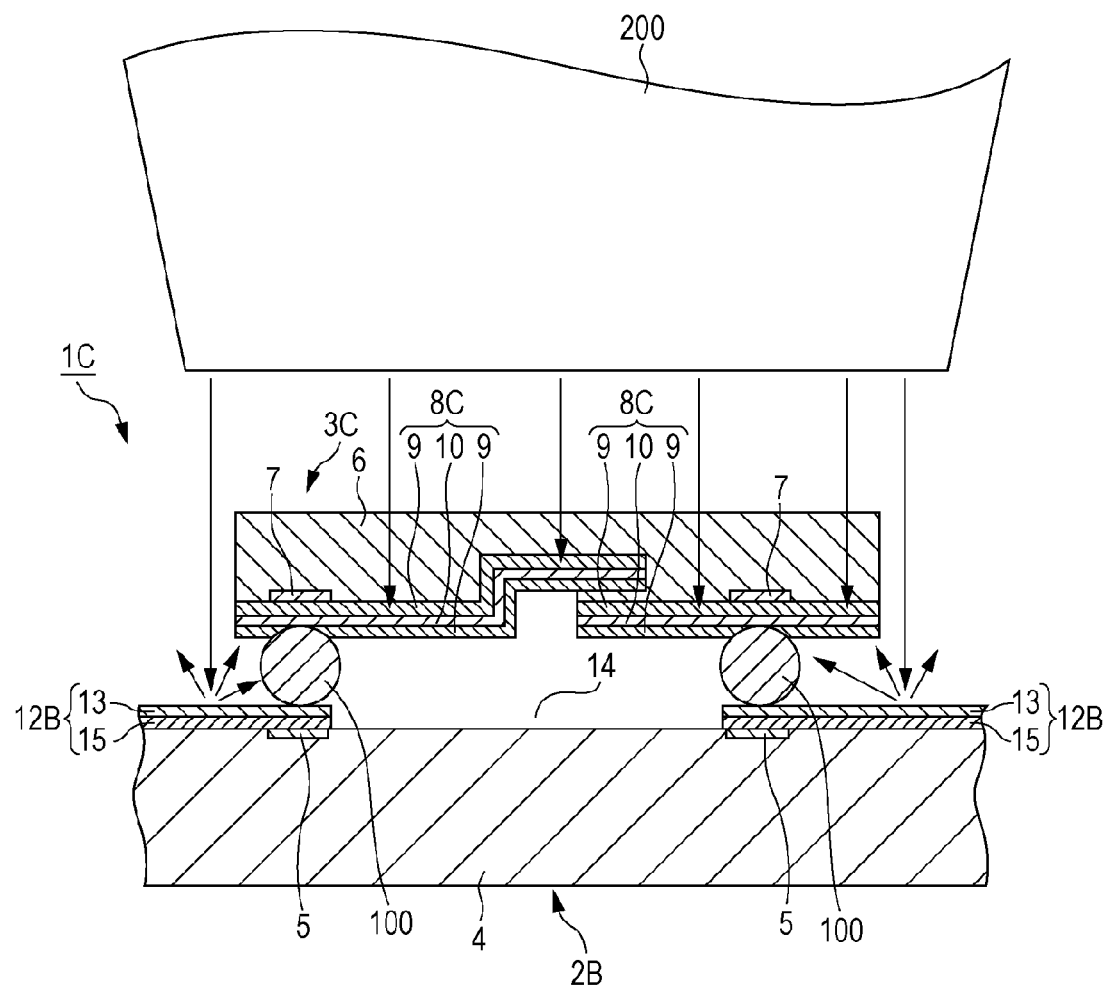
FIG. 14 is an enlarged schematic cross-sectional view illustrating an example in which a void portion is not formed on a lower surface side of a semiconductor element.

FIG. 14 illustrates an example in which the void portion 11 is not formed on a lower surface side of a semiconductor element 3C.

A lower surface side of the semiconductor element 3C is all covered by chip UBM layers 8C, 8C, . . . , and between at least one set of the chip UBM layers 8C and 8C, a portion of the one chip UBM layer 8C is formed at a position (position where a layer in a thickness direction of the semiconductor element 3C is formed) of a layer different from another chip UBM layer 8C. As a result, the chip UBM layers 8C and 8C are formed at positions of the layers different from each other, thereby it is possible to form the chip UBM layers 8C and 8C so as not to directly conduct to each other.

Since the void portion 11 is not formed, it is possible to reduce an area of the light reflecting layer 13 which is formed to suppress damage of the substrate portion 4 on the upper surface side of the base substrate 2B.

Meanwhile, FIG. 14 illustrates an example in which the base substrate 2B is used, but also in the light reflecting layer 13 of the base substrate 2A, it is possible to obtain the same effects as in the base substrate 2B.

Figure 15:
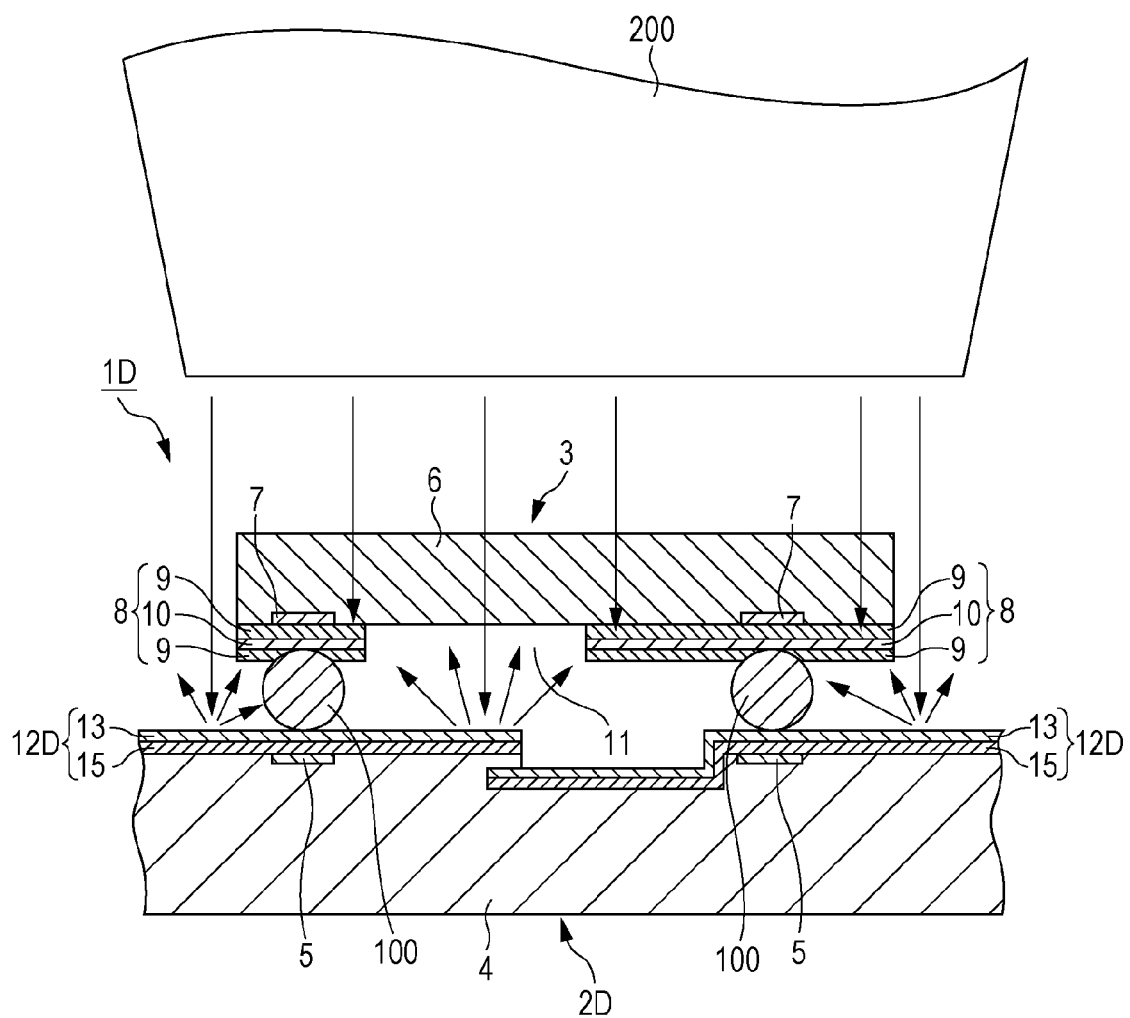
FIG. 15 is an enlarged schematic cross-sectional view illustrating an example in which a void portion is not formed on an upper surface side of a base substrate.

In addition, FIG. 15 illustrates an example in which a void portion 14 is not formed on an upper surface side of a base substrate 2D (second example).

An upper surface side of the base substrate 2D is all covered by substrate UBM layers 12D, 12D . . . , and between at least one set of the substrate UBM layers 12D and 12D, a portion of the one substrate UBM layer 12D is formed at a position (position where a layer in a thickness direction of the base substrate 2D is formed) of a layer different from another substrate UBM layer 12D. As a result, the substrate UBM layers 12D and 12D are formed at positions of the layers different from each other, thereby it is possible to form the substrate UBM layers 12D and 12D so as not to directly conduct to each other.

Since the laser beam which passes through the semiconductor element 3 is not directly irradiated in the substrate portion 4 by the void portion 14 not being formed, it is possible to reduce an area of the chip UBM layer 8 formed in the semiconductor element 3.

10. Summary

As described above, in the semiconductor device 1 (1A, 1B, 1C, 1D) according to the embodiment of the present technology, the light absorbing layer is formed in the semiconductor element 3 (3C), and thus, it is possible to remove the semiconductor element 3 (3C) using the laser beam, and it is unnecessary to coat the light absorbing material. For this reason, it is possible to remove only the failed semiconductor element 3 (3C) from the semiconductor device 1 (1A, 1B, 1C, 1D) without an increase in manufacturing cost.

Meanwhile, the present technology can also employ the following configurations.

(1) A semiconductor device including: a base substrate on which a substrate electrode is arranged; and a semiconductor element which includes a chip electrode electrically connected via solder to the substrate electrode and in which a light absorbing layer is formed on a lower surface side.

(2) The semiconductor device described in (1) in which a heat diffusing layer which is in contact with the light absorbing layer is formed on a lower surface side of the semiconductor element.

(3) The semiconductor device described in (1) or (2) in which a light reflecting layer is formed on an upper surface side of the base substrate.

(4) The semiconductor device described in (3) in which the light reflecting layer is electrically connected to the substrate electrode.

(5) The semiconductor device described in (3) or (4) in which a protection layer which is in contact with the light reflecting layer is formed on a lower surface side of the light reflecting layer.

(6) The semiconductor device described in any one of (3) to (5) in which the semiconductor element has a void portion in which the light absorbing layer is not formed on the lower surface side, and in which the light reflecting layer is formed on a portion which is opposed to the void portion, in the upper surface side of the base substrate.

(7) The semiconductor device described in any one of (1) to (6) in which the light absorbing layer is formed by including any one of Ti, Ni, Pt, Sn and W.

(8) The semiconductor device described in any one of (2) to (7) in which the heat diffusing layer is formed by including any one of Al, Cu, Au and Ag.

(9) The semiconductor device described in any one of (3) to (8) in which the light reflecting layer is formed by including any one of Al, Cu, Au and Ag.

(10) The semiconductor device described in any one of (5) to (9) in which the protection layer is formed by including any one of Ti, Ni, Pt, Sn and W.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    a base substrate on which a substrate electrode is arranged; and
    a semiconductor element which includes a chip electrode at a lower surface side thereof and an under bump metal layer adjacent the chip electrode at the lower surface side, the under bump metal layer electrically connected to the chip electrode and electrically connected via solder to the substrate electrode, the under bump metal layer including a light absorbing layer and a heat diffusing layer.

2. The semiconductor device according to claim 1, wherein the under bump metal layer comprises two light absorbing layers with the heat diffusing layer between the two light absorbing layers.

3. The semiconductor device according to claim 1, comprising a light reflecting layer on an upper surface side of the base substrate.

4. The semiconductor device according to claim 3, wherein the light reflecting layer is electrically connected to the substrate electrode.

5. The semiconductor device according to claim 3, comprising a protection layer in contact with the light reflecting layer and on a lower surface side of the light reflecting layer.

6. The semiconductor device according to claim 3, wherein:
    the semiconductor element has a void portion where there is no under bump metal layer, and
    the light reflecting layer is on a portion of the base substrate which is opposed to the void portion.

7. The semiconductor device according to claim 1, wherein the light absorbing layers include Ti, Ni, Sn, Pt or W.

8. The semiconductor device according to claim 2, wherein the heat diffusing layer includes Al, Cu, Au or Ag.

9. The semiconductor device according to claim 3, wherein the light reflecting layer includes Al, Cu, Au or Ag.

10. The semiconductor device according to claim 5, wherein the protection layer includes Ti, Ni, Pt, Sn or W.

11. A semiconductor device comprising:
    a base substrate with an upper surface side;
    a first electrode at the upper surface side of the base substrate;
    a device secured to the base substrate;
    a second electrode at a lower surface side of the device, the lower surface side of the device facing the upper surface side of the base substrate;
    an under bump metal layer at the lower surface side of the device, the under bump metal layer in electrical connection with the second electrode, the under bump metal layer comprised of two light absorbing layer and a heat diffusing layer between the two light absorbing layers, each of the light absorbing layer comprised of Ti, Ni, Sn, Pt or W, the heat diffusing layer comprised of Al, Cu, Au or Ag; and
    solder securing the metal bump metal layer to the first electrode.

* * * * *